(12) United States Patent
Nakano et al.

(10) Patent No.: US 11,728,096 B2
(45) Date of Patent: Aug. 15, 2023

(54) MULTILAYER CERAMIC CAPACITOR (71) Applicant: Murata Manufacturing Co., Ltd., Nagaokakyo (JP)

(72) Inventors: Suguru Nakano, Nagaokakyo (JP); Satoshi Muramatsu, Nagaokakyo (JP); Risa Hojo, Nagaokakyo (JP); Yoshiyuki Nomura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 406 days.

(21) Appl. No.: 17/119,263

(22) Filed: Dec. 11, 2020

(65) Prior Publication Data

US 2021/0183581 A1 Jun. 17, 2021

(30) Foreign Application Priority Data

Dec. 12, 2019 (JP) .................................. 2019-224655

(51) Int. Cl.
*H01G 4/30* (2006.01)
*H01G 4/012* (2006.01)
(Continued)

(52) U.S. Cl.
CPC .............. *H01G 4/30* (2013.01); *H01G 2/065* (2013.01); *H01G 4/008* (2013.01); *H01G 4/012* (2013.01); *H01G 4/1218* (2013.01)

(58) Field of Classification Search
CPC .......... H01G 4/30; H01G 2/065; H01G 4/012; H01G 4/1218; H01G 4/008
(Continued)

(56) References Cited

U.S. PATENT DOCUMENTS 9,390,858 B2 * 7/2016 Abe ..................... H01G 13/003
2002/0141137 A1 10/2002 Honda et al.
(Continued)

FOREIGN PATENT DOCUMENTS

CN 1542878 A 11/2004
JP 2017135239 A * 8/2017
(Continued)

OTHER PUBLICATIONS

Official Communication issued in corresponding Chinese Patent Application No. 202011413259.0, dated Mar. 28, 2022.

*Primary Examiner* — Arun Ramaswamy
(74) *Attorney, Agent, or Firm* — Keating & Bennett, LLP (57) ABSTRACT

A multilayer ceramic capacitor includes a laminate including dielectric layers and internal electrode layers, and external electrodes on surfaces of the laminate. A silane coupling agent layer is on at least a mounting surface among surfaces of the laminate. The silane coupling agent layer is made of a fluorine-based silane coupling agent, and a silane coupling agent concentration on the mounting surface is about 0.1 or higher and about 365 or lower and is higher than a silane coupling agent concentration on a counter surface opposing the mounting surface, or the silane coupling agent layer is made of a carbon-based silane coupling agent, and a silane coupling agent concentration on the mounting surface is about 0.91 or higher and about 38.10 or lower and is higher than a silane coupling agent concentration on a counter surface opposing the mounting surface.

20 Claims, 5 Drawing Sheets

(51) Int. Cl.
*H01G 2/06* (2006.01)
*H01G 4/12* (2006.01)
*H01G 4/008* (2006.01)

(58) Field of Classification Search
USPC ..... 361/321.1, 321.2, 301.4, 311, 312, 321.5
See application file for complete search history.

(56) References Cited

U.S. PATENT DOCUMENTS

| | | | | |
|---|---|---|---|---|
| 2010/0302704 | A1* | 12/2010 | Ogawa | H01G 4/2325 |
| | | | | 361/306.3 |
| 2011/0193448 | A1* | 8/2011 | Saruban | H01G 4/005 |
| | | | | 336/200 |
| 2011/0287176 | A1* | 11/2011 | Saito | H01G 2/103 |
| | | | | 427/126.2 |
| 2016/0042864 | A1* | 2/2016 | Hong | H01G 4/30 |
| | | | | 361/301.4 |
| 2018/0082785 | A1* | 3/2018 | Asano | H01G 4/232 |
| 2018/0218839 | A1 | 8/2018 | Watabe et al. | |

FOREIGN PATENT DOCUMENTS

| | | | |
|---|---|---|---|
| JP | 2018014447 A | * | 1/2018 |
| JP | 2018-121010 A | | 8/2018 |

* cited by examiner

MULTILAYER CERAMIC CAPACITOR

CROSS REFERENCE TO RELATED APPLICATIONS

This application claims the benefit of priority to Japanese Patent Application No. 2019-224655 filed on Dec. 12, 2019. The entire contents of this application are hereby incorporated herein by reference.

BACKGROUND OF THE INVENTION

1. Field of the Invention

The present invention relates to a multilayer ceramic capacitor.

2. Description of the Related Art

Electronic devices, such as mobile phones and portable music players, have been reduced in size and thickness. Electronic devices include many multilayer ceramic electronic components, such as multilayer ceramic capacitors. These multilayer ceramic electronic components, which are embedded in a substrate or mounted on a substrate surface, have also been reduced in size and thickness along with the reduction in size of electronic devices. Such reduction in thickness of multilayer ceramic electronic components has led to difficulty in providing sufficient strength to the multilayer ceramic electronic components.

JP 2018-121010 A discloses a low-profile multi-layer ceramic electronic component, including a ceramic body, a first external electrode, and a second external electrode. The ceramic body includes a first main surface and a second main surface that are oriented in a first axial direction, a first end surface and a second end surface that are oriented in a second axial direction orthogonal to the first axial direction, a first internal electrode that is drawn to the first end surface, and a second internal electrode that faces the first internal electrode and is drawn to the second end surface, the ceramic body being formed to be long in a third axial direction orthogonal to the first axial direction and the second axial direction. The first external electrode includes a first cover portion that covers the first end surface, and a first extension portion that extends from the first cover portion to the second main surface. The second external electrode includes a second cover portion that covers the second end surface, and a second extension portion that extends from the second cover portion to the second main surface. In the multi-layer ceramic electronic component disclosed in JP 2018-121010 A, when $T_1$ represents a dimension of the ceramic body in the first axial direction, and when $T_2$ represents a dimension of each of the first extension portion and the second extension portion in the first axial direction, $T_1$ is 80 μm or less and $T_2/(T_1+T_2)$ is 0.32 or less.

According to JP 2018-121010 A, the first and second external electrodes are provided along the longitudinal direction of the ceramic body, and the ceramic body is reinforced by the first external electrode and the second external electrode. In this configuration, the ratio of the thickness $T_2$ of each of the first and second extension portions to the thickness $(T_1+T_2)$ of the multi-layer ceramic electronic component is set to 0.32 or less. Thus, high flexural strength in the longitudinal direction of the ceramic body and the first and second external electrodes can be obtained.

Conventionally, electronic components, such as multilayer ceramic capacitors, are mounted on a substrate by applying a solder paste containing a conductive material to the lands on the substrate, mounting the electronic components, and reflowing the solder paste. This establishes electrical connection between the substrate and the electronic components.

Meanwhile, there is a method called flux mounting which mounts electronic components other than multilayer ceramic capacitors on a substrate. In this method, electronic components are mounted on a substrate using a thermosetting resin flux containing no conductive material, instead of a solder paste containing a conductive material. This method uses the melt of external electrodes defining the electronic components to connect the lands and the external electrodes and thereby establish electrical connection therebetween through a reflow process. The flux itself contributes to removal of oxides on the land surfaces and external electrodes due to its organic acid and contributes to enhancement of the adhesion between the electronic components and the lands.

Flux mounting using a thermosetting resin flux containing no conductive material is expected to achieve better effects of decreasing the mounting thickness and increasing the thermal shock resistance than solder mounting using a solder paste containing a conductive material.

However, flux mounting for a multilayer ceramic capacitor, such as the one disclosed in JP 2018-121010 A, was found to cause corrosion of the multilayer ceramic capacitor, thus, decreasing the moisture proof reliability.

SUMMARY OF THE INVENTION

Preferred embodiments of the present invention provide multilayer ceramic capacitors in each of which a decrease in moisture proof reliability due to flux mounting is reduced or prevented.

A multilayer ceramic capacitor according to a preferred embodiment of the present invention includes a laminate including a plurality of dielectric layers and a plurality of internal electrode layers laminated together; and external electrodes that are on surfaces of the laminate and electrically connected to the internal electrode layers. A silane coupling agent layer is on at least a mounting surface among surfaces of the laminate.

The silane coupling agent layer may be made of a fluorine-based silane coupling agent, and a silane coupling agent concentration, defined as a ratio F/Ba of a F atom concentration to a Ba atom concentration on the laminate, on the mounting surface is about 0.1 or higher and about 365 or lower and is higher than a silane coupling agent concentration on a counter surface opposing the mounting surface.

The silane coupling agent layer may be made of a carbon-based silane coupling agent, and a silane coupling agent concentration, defined as a ratio Si/Ba of a Si atom concentration to a Ba atom concentration on the laminate, on the mounting surface is about 0.91 or higher and about 38.10 or lower and is higher than a silane coupling agent concentration on a counter surface opposing the mounting surface.

Preferred embodiments of the present invention are each able to provide a multilayer ceramic capacitor in which a decrease in moisture proof reliability due to flux mounting is reduced or prevented.

The above and other elements, features, steps, characteristics and advantages of the present invention will become

DETAILED DESCRIPTION OF THE PREFERRED EMBODIMENTS

Hereinafter, multilayer ceramic capacitors according to preferred embodiments of the present invention will be described with reference to the drawings.

The present invention is not limited to the following preferred embodiments, and may be suitably modified without departing from the gist of the present invention. Combinations of two or more preferred features described in the following preferred embodiments are also within the scope of the present invention.

Examples of multilayer ceramic capacitors according to preferred embodiments of the present invention include two-terminal multilayer ceramic capacitors including two external electrodes and three- or multi-terminal multilayer ceramic capacitors. Multilayer ceramic capacitor according to preferred embodiments of the present invention may also be a multilayer ceramic capacitor including a via conductor, a multilayer ceramic capacitor including a bottom electrode, or the like.

Figure 1:
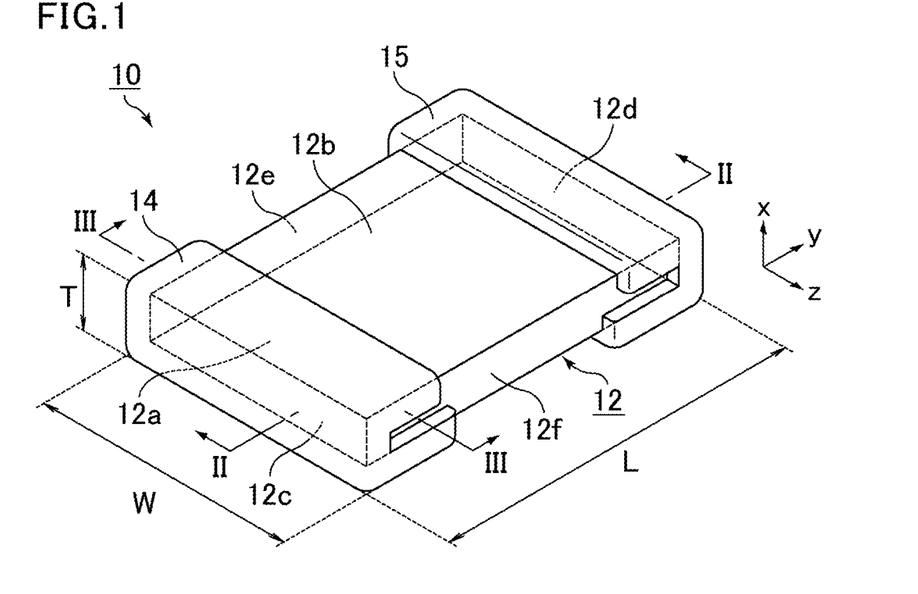
FIG. 1 is a perspective view schematically showing an example of a multilayer ceramic capacitor according to a preferred embodiment of the present invention.
Figure 2:
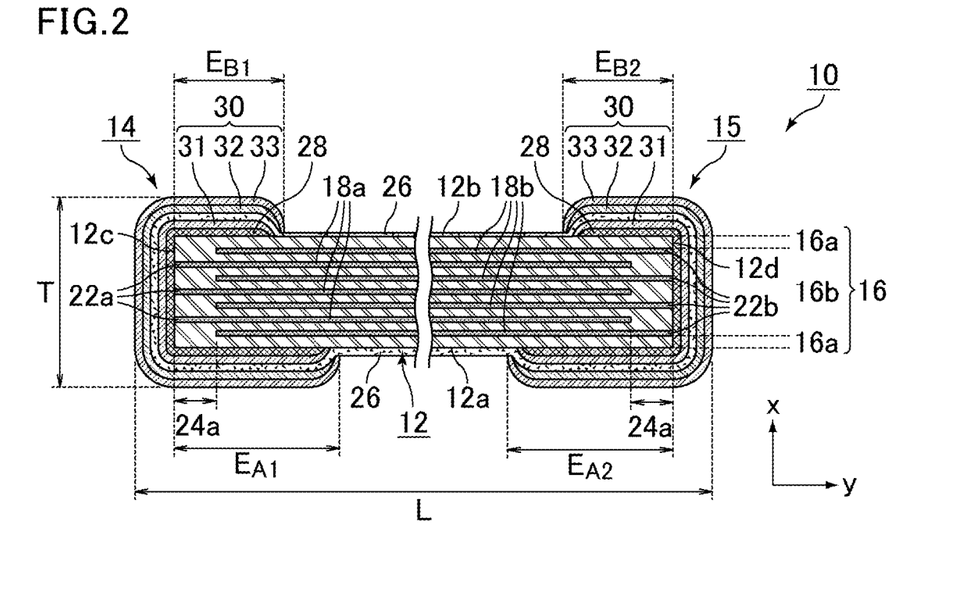
FIG. 2 is a cross-sectional view taken along the line II-II of the multilayer ceramic capacitor shown in FIG. 1.
Figure 3:
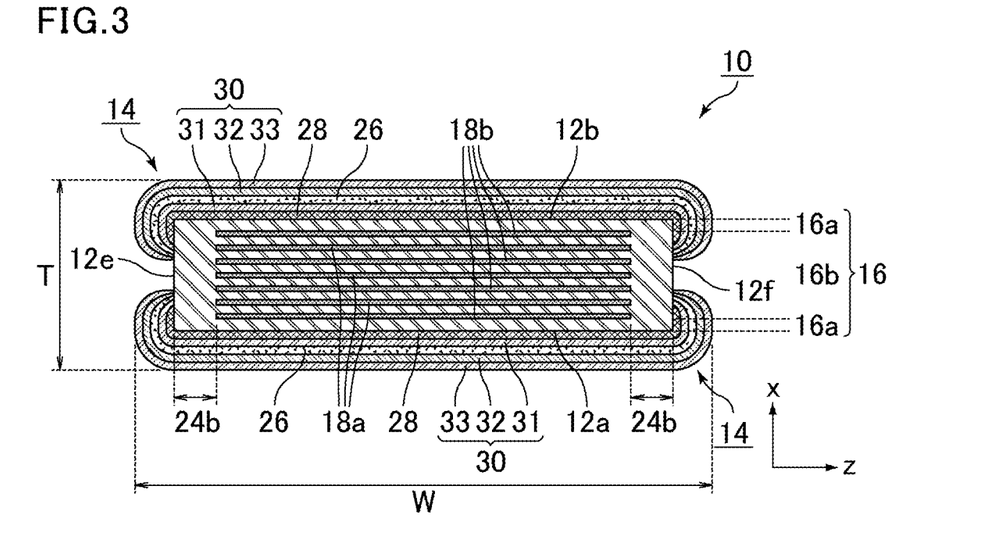
FIG. 3 is a cross-sectional view taken along the line III-III of the multilayer ceramic capacitor shown in FIG. 1.

FIG. 1 is a perspective view schematically showing an example of a multilayer ceramic capacitor according to a preferred embodiment of the present invention. FIG. 2 is a cross-sectional view taken along the line II-II of the multilayer ceramic capacitor shown in FIG. 1. FIG. 3 is a cross-sectional view taken along the line III-III of the multilayer ceramic capacitor shown in FIG. 1.

A multilayer ceramic capacitor 10 shown in FIG. 1 includes a laminate 12, which is a rectangular or substantially rectangular cuboid, first external electrodes 14, and second external electrodes 15.

The laminate 12 includes a first main surface 12a and a second main surface 12b that oppose each other in a lamination direction x, a first side surface 12c and a second side surface 12d that oppose each other in a length direction y perpendicular or substantially perpendicular to the lamination direction x, and a third side surface 12e and a fourth side surface 12f that oppose each other in a width direction z perpendicular or substantially perpendicular to the lamination direction x and the length direction y. The first main surface 12a and the second main surface 12b each extend in the length direction y and the width direction z. The first side surface 12c and the second side surface 12d each extend in the lamination direction x and the width direction z. The third side surface 12e and the fourth side surface 12f each extend in the lamination direction x and the length direction y.

Herein, a surface of the multilayer ceramic capacitor 10 or the laminate 12 extending in the length direction y and the lamination direction x is referred to as an LT surface. A surface extending in the length direction y and the width direction z is referred to as an LW surface. A surface extending in the lamination direction x and the width direction z is referred to as a WT surface.

When the multilayer ceramic capacitor 10 shown in FIG. 1 is mounted on a substrate, the first main surface 12a of the laminate 12 is a mounting surface and the second main surface 12b of the laminate 12 is a counter surface.

Preferably, corners and ridges of the laminate 12 are rounded. The corner is a portion where three surfaces of the laminate 12 meet, and the ridge is a portion where two surfaces of the laminate 12 meet.

As shown in FIG. 2 and FIG. 3, the laminate 12 includes a plurality of dielectric layers 16, a plurality of first internal electrode layers 18a, and a plurality of second internal electrode layers 18b laminated in the lamination direction x.

The dielectric layers 16 include outer layer portions 16a and an effective layer portion 16b. The outer layer portions 16a are located closer to the first main surface 12a or the second main surface 12b of the laminate 12. Specifically, they correspond to the dielectric layer(s) 16 between the first main surface 12a and the internal electrode layer closest to the first main surface 12a (a second internal electrode layer 18b in FIG. 2) and the dielectric layer(s) 16 between the second main surface 12b and the internal electrode layer closest to the second main surface 12b (a second internal electrode layer 18b in FIG. 2). One of the outer layer portions 16a preferably has a thickness of, for example, about 3 μm or greater and about 25 μm or smaller, more preferably about 3 μm or greater and about 13 μm or smaller, and still more preferably about 3 μm or greater and about 9 μm or smaller. The region sandwiched by the outer layer portions 16a is the effective layer portion 16b. In other words, the effective layer portion 16b is the region where the first internal electrode layers 18a and the second internal electrode layers 18b are laminated.

The dielectric layers 16 can be made of a dielectric material, for example. The dielectric material can be a dielectric ceramic including barium titanate, calcium titanate, strontium titanate, barium calcium titanate, or calcium zirconate as the main component, for example. When including the dielectric material as a main component, the dielectric layers 16 may include, for example, an accessory component such as a Mg compound, a Mn compound, a Si compound, an Al compound, a V compound, a Ni compound, or a rare earth compound, in an amount less than the amount of the main component, depending on the desired characteristics of the multilayer ceramic capacitor 10.

The average thickness of the dielectric layers 16 each sandwiched by a first internal electrode layer 18a and a second internal electrode layer 18b is preferably about 0.4 μm or greater and about 1.0 μm or smaller, more preferably about 0.4 μm or greater and about 0.8 μm or smaller, and still more preferably about 0.4 μm or greater and about 0.6 μm or smaller, for example.

In the laminate 12, the first internal electrode layers 18a and the second internal electrode layers 18b are alternately laminated with a dielectric layer 16 in between.

Each first internal electrode layer 18a is on a surface of a dielectric layer 16. The first internal electrode layer 18a is extracted to the first side surface 12c of the laminate 12 by a first extractor 22a. The first internal electrode layer 18a is not exposed on a second side surface 12d, a third side surface 12e, or a fourth side surface 12f of the laminate 12.

Each second internal electrode layer 18b is on a surface of a dielectric layer 16 different from dielectric layers 16 on which a first internal electrode layer 18a is provided. The second internal electrode layer 18b is extracted to the second side surface 12d of the laminate 12 by a second extractor 22b. The second internal electrode layer 18b is not exposed on a first side surface 12c, a third side surface 12e, or a fourth side surface 12f of the laminate 12.

As shown in FIG. 2, the laminate 12 includes side portions (L gaps) 24a provided between the first ends in the length direction y of the second internal electrode layers 18b and the first side surface 12c and between the second ends in the length direction y of the first internal electrodes layer 18a and the second side surface 12d. The average length in the length direction y of each side portion (L gap) 24a of the laminate 12 is preferably about 10 μm or longer and about 70 μm or shorter, more preferably about 10 μm or longer and about 30 μm or shorter, and still more preferably about 10 μm or longer and about 20 μm or shorter, for example.

As shown in FIG. 3, the laminate 12 includes side portions (W gaps) 24b provided between the first ends in the width direction z of both of the first internal electrode layers 18a and the second internal electrode layers 18b and the third side surface 12e and between the second ends in the width direction z of both of the first internal electrode layers 18a and the second internal electrode layers 18b and the fourth side surface 12f. The average length in the width direction z of each side portion (W gap) 24b of the laminate 12 is preferably about 10 μm or longer and about 70 μm or shorter, more preferably about 10 μm or longer and about 30 μm or shorter, and still more preferably about 10 μm or longer and about 20 μm or shorter, for example.

The first internal electrode layers 18a and the second internal electrode layers 18b may preferably be made of, for example, a metal such as Ni, Cu, Ag, Pd, or Au, or an alloy including at least one of these metals, such as an Ag—Pd alloy. The first internal electrode layers 18a and the second internal electrode layers 18b may further include dielectric particles having the same or substantially the same composition as the ceramic included in the dielectric layers 16. The total number of the first internal electrode layers 18a and the second internal electrode layers 18b laminated is preferably about 10 or more and about 80 or less, for example. The average thickness of the first internal electrode layers 18a and the second internal electrode layers 18b is preferably about 0.3 μm or greater and bout 1.0 μm or smaller, and more preferably about 0.6 μm or greater and about 1.0 μm or smaller, for example.

A first external electrode 14 is on the first side surface 12c of the laminate 12. The first external electrode 14 is electrically connected to the first extractors 22a of the first internal electrode layers 18a.

The first external electrode 14 covers the first extractors 22a on the first side surface 12c and partly covers the first main surface 12a and the second main surface 12b. The first external electrode 14 may not be on the second main surface 12b. The first external electrode 14 may partly cover the third side surface 12e and the fourth side surface 12f.

The second external electrode 15 is on the second side surface 12d of the laminate 12. The second external electrode 15 is electrically connected to the second extractors 22b of the second internal electrode layers 18b.

The second external electrode 15 covers the second extractors 22b on the second side surface 12d and partly covers the first main surface 12a and the second main surface 12b. The second external electrode 15 may not be on the second main surface 12b. The second external electrode 15 may partly cover the third side surface 12e and the fourth side surface 12f.

In the laminate 12, the first internal electrode layers 18a and the second internal electrode layers 18b oppose each other with a dielectric layer 16 in between, so that the electrical characteristics (e.g., capacitance) are generated. This produces capacitance between the first external electrode 14 electrically connected to the first internal electrode layers 18a and the second external electrode 15 electrically connected to the second internal electrode layers 18b. The multilayer ceramic capacitor 10 thus defines and functions as a capacitor.

A silane coupling agent layer 26 is on the first main surface 12a, which is the mounting surface, among the surfaces of the laminate 12. The silane coupling agent layer 26 is preferably on the entire or a portion of the first main surface 12a without the first external electrode 14 and the second external electrode 15.

In the multilayer ceramic capacitor 10, the silane coupling agent layer 26 may be on at least the mounting surface among the surfaces of the laminate 12. The silane coupling agent layer 26 may be on the counter surface among the surfaces of the laminate 12. In other words, the silane coupling agent layer 26 may be on the second main surface 12b as well as the first main surface 12a. In this case, the silane coupling agent layer 26 is preferably on the entire or a portion of the second main surface 12b without the first external electrode 14 and the second external electrode 15.

Moreover, in the multilayer ceramic capacitor 10, the silane coupling agent layer 26 may be on a surface other than the mounting surface and counter surface among the surfaces of the laminate 12. In other words, the silane coupling agent layer 26 may be on the first side surface 12c, the second side surface 12d, the third side surface 12e, and the fourth side surface 12f as well as the first main surface 12a and the second main surface 12b. In this case, the silane coupling agent layer 26 is preferably on the entire or a portion of the first side surface 12c, the second side surface 12d, the third side surface 12e, and the fourth side surface 12f without the first external electrode 14 and the second external electrode 15.

The first external electrode 14 and the second external electrode 15 each preferably include a base electrode layer 28 and a plating layer 30 sequentially from the laminate 12 side.

The base electrode layer 28 includes side surface base electrode layers to be provided on the first side surface 12c and the second side surface 12d, and they are each preferably a baked electrode layer. The baked electrode layer includes glass and metal. The metal of the baked electrode layer preferably includes, for example, at least one selected from Cu, Ni, Ag, Pd, an Ag—Pd alloy, Au, and the like. The baked electrode layer may have a multilayer structure. The baked electrode layer is formed by applying a conductive paste including glass and metal to the laminate 12 and baking the paste. The baked electrode layer may be simultaneously fired with the dielectric layers 16, the first internal electrode layers 18a, and the second internal electrode layers 18b, or may be baked after the dielectric layers 16, the first internal electrode layers 18a, and the second internal electrode layers 18b are fired. The thickness of the baked electrode layer (thickness of the thickest portion in the direction perpendicular or substantially perpendicular to the lamination direction x) is preferably about 1 μm or greater and about 6 μm or smaller, for example.

The base electrode layer 28 also includes main surface base electrode layers to be provided on the first main surface 12a and the second main surface 12b, and they are each formed as a sputtering electrode by sputtering, for example. The sputtering electrode includes a metal such as Ni, Cr, or Cu, for example. The thickness in the lamination direction x of the sputtering electrode is preferably about 50 nm or greater and about 400 nm or smaller, more preferably about 50 nm or greater and about 130 nm or smaller, for example. The main surface base electrode layers may each be a baked electrode layer. In this case, the main surface base electrode layers are formed by screen printing of an external electrode paste including Ni as a main component, for example. The thickness in the lamination direction x of the baked electrode layer on each main surface is preferably about 1 μm or greater and about 5 μm or smaller, for example.

The plating layer 30 preferably includes, for example, at least one selected from Ni, Sn, Cu, Ag, Pd, an Ag—Pd alloy, Au, and the like. The plating layer 30 may be a multilayer structure.

In the example shown in FIG. 2, the plating layer 30 includes a Cu plating layer 31, a Ni plating layer 32, and a Sn plating layer 33 sequentially from the base electrode layer 28 side. In this case, the silane coupling agent layer 26 is preferably between the Cu plating layer 31 and the Ni plating layer 32.

The Ni plating layer 32 can prevent the base electrode layer 28 from being eroded by solder used to mount the multilayer ceramic capacitor 10. The Sn plating layer 33 can improve the wettability of solder used to mount the multilayer ceramic capacitor 10, thus facilitating mounting of the multilayer ceramic capacitor 10.

The Cu plating layer 31 preferably has an average thickness of about 5 μm or greater and about 8 μm or smaller, for example. The Ni plating layer 32 preferably has an average thickness of about 2 μm or greater and about 4 μm or smaller, for example. The Sn plating layer 33 preferably has an average thickness of about 2 μm or greater and about 4 μm or smaller, for example.

Figure 4:
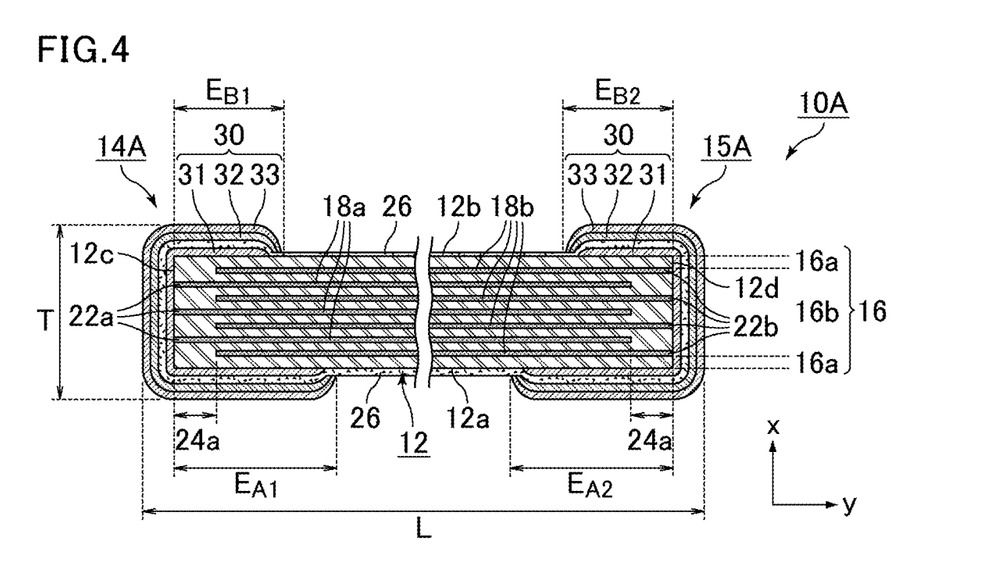
FIG. 4 is a cross-sectional view schematically showing example external electrodes defining a multilayer ceramic capacitor according to a preferred embodiment of the present invention.
Figure 5A:
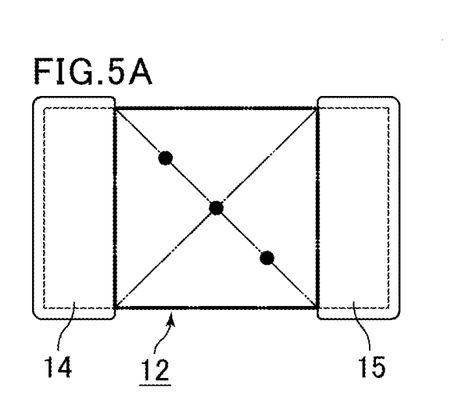
FIGS. 5A to 5D are plan views showing sites to be analyzed by XPS.
Figure 5B:
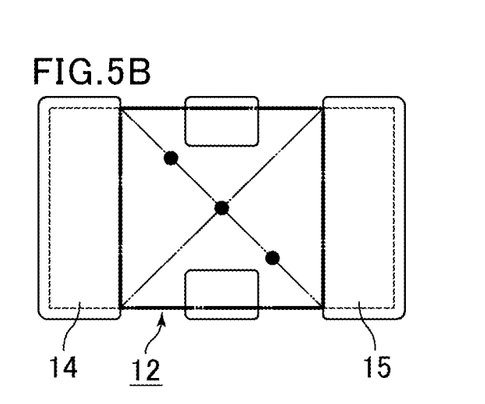
Figure 5C:
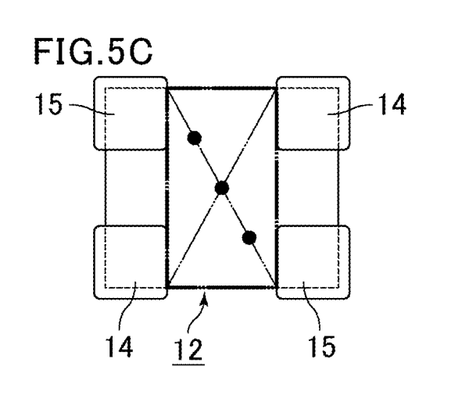
Figure 5D:
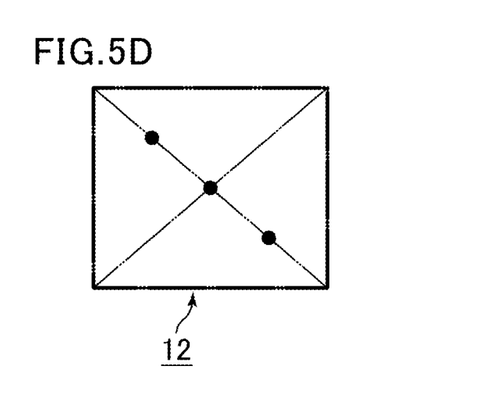

FIG. 4 is a cross-sectional view schematically showing example external electrodes defining a multilayer ceramic capacitor according to a preferred embodiment of the present invention.

In a multilayer ceramic capacitor 10A shown in FIG. 4, a first external electrode 14A and a second external electrode 15A each include a plating layer 30 but no base electrode layer 28. The plating layer 30 includes a Cu plating layer 31, a Ni plating layer 32, and a Sn plating layer 33 sequentially from the laminate 12 side. In this case, a silane coupling agent layer 26 is preferably between the Cu plating layer 31 and the Ni plating layer 32.

The silane coupling agent layer 26 is made of a fluorine-based silane coupling agent or a carbon-based silane coupling agent.

In the case where the silane coupling agent layer is made of a fluorine-based silane coupling agent, the silane coupling agent concentration, defined as a ratio F/Ba of a F atom concentration to a Ba atom concentration on the laminate, on the mounting surface is preferably, for example, about 0.1 or higher and about 365 or lower and is higher than the silane coupling agent concentration on the counter surface opposing the mounting surface.

In the case where the silane coupling agent layer is made of a carbon-based silane coupling agent, the silane coupling agent concentration, defined as a ratio Si/Ba of a Si atom concentration to a Ba atom concentration on the laminate, on the mounting surface is preferably, for example, about 0.91 or higher and about 38.10 or lower and is higher than the silane coupling agent concentration on the counter surface opposing the mounting surface.

Providing the silane coupling agent layer on the mounting surface of the laminate can prevent entry of moisture or flux into the laminate from the outside. This can reduce or prevent corrosion caused by an organic acid included in the flux in flux mounting, thus preventing a decrease in the moisture proof reliability.

Meanwhile, a higher silane coupling agent concentration on the mounting surface leads to a lower plating adhesion of the external electrodes. The silane coupling agent concentration on the mounting surface is therefore brought into one of the ranges described above, so that the decrease in plating adhesion can be reduced or prevented while a decrease in moisture proof reliability is reduced or prevented.

The silane coupling agent concentration on the mounting surface being higher than the silane coupling agent concentration on the counter surface means that, for example, applying the silane coupling agent to only the mounting surface achieves the advantageous effect. This eliminates the need to apply the silane coupling agent to the entire surface of the laminate, allowing selection of an application process without a load on the laminate (e.g., immersion, spray coating, ink jetting, spin coating after fixation of the laminate on a support).

The above features enable flux mounting, thus reducing the height of the multilayer ceramic capacitor and improving the thermal shock resistance.

In the case where the silane coupling agent layer is made of a fluorine-based silane coupling agent, the silane coupling agent concentration on the mounting surface is preferably about 0.1 or higher and about 293 or lower, for example. Plating adhesion failure can be reduced or minimized with the silane coupling agent concentration on the mounting surface falling within the above range.

In the case where the silane coupling agent layer is made of a fluorine-based silane coupling agent or a carbon-based silane coupling agent, a silane coupling agent concentration ratio B/A is preferably, for example, about 0.50 or less, where A represents a silane coupling agent concentration on the mounting surface and B represents a silane coupling agent concentration on the counter surface. Even in such a case where the silane coupling agent concentration on the counter surface is lower than that on the mounting surface, the advantageous effect described above is achieved.

Each of these atomic concentrations can be measured by X-ray photoelectron spectroscopy analysis (hereinafter, also referred to as XPS analysis).

In the case where the silane coupling agent layer is made of a fluorine-based silane coupling agent, a silane coupling agent concentration A on the mounting surface and a silane coupling agent concentration B on the counter surface are calculated from the following formulas (1) and (2), respectively, using the ratio between the concentration of F atoms derived from the silane coupling agent and the concentration of Ba atoms derived from the laminate. In addition, the silane coupling agent concentration ratio B/A is determined as the ratio (2)/(1).

$$A=(\text{F atom concentration on mounting surface})/(\text{Ba atom concentration on mounting surface}) \quad (1)$$

$$B=(\text{F atom concentration on counter surface})/(\text{Ba atom concentration on counter surface}) \quad (2)$$

In the case where the silane coupling agent layer is made of a carbon-based silane coupling agent, the silane coupling agent concentration A on the mounting surface and the silane coupling agent concentration B on the counter surface are calculated from the following formulas (3) and (4), respectively, using the ratio between the concentration of Si atoms derived from the silane coupling agent and the concentration of Ba atoms derived from the laminate. In addition, the silane coupling agent concentration ratio B/A is determined as the ratio (4)/(3).

$$A=(\text{Si atom concentration on mounting surface})/(\text{Ba atom concentration on mounting surface}) \quad (3)$$

$$B=(\text{Si atom concentration on counter surface})/(\text{Ba atom concentration on counter surface}) \quad (4)$$

In the examples described below, the X-ray photoelectron spectrometer can be, for example, Quantum 2000 available from ULVAC-PHI, Inc. In this case, a region with a diameter of about 50 μm and an analytic depth of several nanometers is measured. The X-ray source is an AlKα ray. The survey scan is repeated 30 times with an energy range for the survey scan of about 0 eV or more and about 1200 eV or less.

FIGS. 5A to 5D are plan views showing sites to be analyzed by XPS.

The following three points on the mounting surface and the counter surface are subjected to XPS analysis to calculate the average for each element ratio (each atomic ratio).

1. The centroid of a quadrangle surrounded by black dotted lines on the laminate 12 without the external electrodes 14 and 15.
2. Two points on one diagonal line, one at the midpoint between a vertex of the quadrangle and the centroid and the other at the midpoint between another vertex and the centroid.

The fluorine-based silane coupling agent in the silane coupling agent layer is preferably a silane coupling agent represented by:

$$CF_3-(CF_2)_{n1}-R-Si(O-R')_3$$

where n1 is an integer of 0 or greater, R is a substituent containing Si or O or alkylene group, and R' is an alkyl group. For example, n1 may be an integer of 0 or greater and 7 or smaller. R' may be a methyl or ethyl group.

The silane coupling agent includes at least one alkoxy group, which is a reactive group. The silane coupling agent also contains at least one perfluoroalkyl group.

The fluorine-based silane coupling agent can be, for example, $CF_3(CF_2)_5(CH_2)_2Si(OCH_3)_3$,
$CF_3(CF_2)_3(CH_2)_2Si(OCH_3)_3$,
$CF_3(CF_2)_3(CH_2)_2Si(OC_2H_5)_3$,
$CF_3(CF_2)_7(CH_2)_2Si(OCH_3)_3$,
$CF_3CH_2O(CH_2)_{15}Si(OCH_3)_3$,
$CF_3(CH_2)_2Si(CH_3)_2(CH_2)_{15}Si(OCH_3)_3$,
$CF_3(CF_2)_3(CH_2)_2Si(CH_3)_2(CH_2)_9Si(OCH_3)_3$,
$CF_3COO(CH_2)_{15}Si(OCH_3)_3$,
$CF_3(CF_2)_5(CH_2)_2Si(OC_2H_5)_3$,
$CF_3(CF_2)_7(CH_2)_2Si(OC_2H_5)_3$,
$CF_3(CF_2)_7(CH_2)_2Si(CH_3)_2(CH_2)_9Si(OC_2H_5)_3$,
$CF_3(CF_2)_7(CH_2)_2Si(CH_3)_2(CH_2)_6Si(OC_2H_5)_3$,
$CF_3(CF_2)_7(CH_2)_2Si(OC_2H_5)_3$,
$CF_3CH_2O(CH_2)_{15}Si(OC_2H_5)_3$,
$CF_3COO(CH_2)_{15}Si(OC_2H_5)_3$,
$CF_3(CF_2)_4CONH(CH_2)_3Si(OCH_3)_3$,
$CF_3(CF_2)_7CONH(CH_2)_3Si(OCH_3)_3$,
$CF_3(CF_2)_5CONH(CH_2)_3Si(OC_2H_5)_3$, or
$CF_3(CF_2)_7CONH(CH_2)_3Si(OC_2H_5)_3$.

The carbon-based silane coupling agent in the silane coupling agent layer is preferably a silane coupling agent represented by:

$$(RO)_3Si-(CH_2)_{n2}-CH_3$$

where n2 is an integer of 0 or greater and 17 or smaller and R is a methyl or ethyl group.

The carbon-based silane coupling agent can be, for example, Shin-Etsu Chemical Co., Ltd.: KBM-3103C (decyltrimethoxysilane), KBM-13 (methyltrimethoxysilane), KBE-13 (methyltriethoxysilane), KBM-3033 (n-propyltrimethoxysilane), KBE-3033 (n-propyltriethoxysilane), KBM-3063 (hexyltrimethoxysilane), KBE-3063 (hexyltriethoxysilane), or Tokyo Chemical Industry Co., Ltd. (TCI): octadecyltrimethoxysilane.

The carbon-based silane coupling agent can also be, for example, any one of Shin-Etsu Chemical Co., Ltd.: KBM-103 (phenylmethoxysilane), KBM-3066 (1,6-bis(trimethoxysilyl)hexane), or KBM-9659 (tris-(trimethoxysilylpropyl) isocyanurate).

As shown in FIG. 2, a length ratio $E_{B1}/E_{A1}$ of the first external electrode wrapping around to the main surfaces is preferably, for example, about 0 or more and about 0.5 or less, where $E_{A1}$ represents a distance from an end of the first external electrode 14 wrapping around to the first main surface 12a of the laminate 12 to the first side surface 12c of the laminate 12, and $E_{B1}$ represents a distance from an end of the first external electrode 14 wrapping around to the second main surface 12b of the laminate 12 to the first side surface 12c of the laminate 12. In addition, a length ratio $E_{B2}/E_{A2}$ of the second external electrode wrapping around to the main surfaces is preferably, for example, about 0 or more and about 0.5 or less, where $E_{A2}$ represents a distance from an end of the second external electrode 15 wrapping around to the first main surface 12a of the laminate 12 to the second side surface 12d of the laminate 12, and $E_{B2}$ represents a distance from an end of the second external electrode 15 wrapping around to the second main surface 12b of the laminate 12 to the second side surface 12d of the laminate 12. The same applies to the first external electrode 14A and the second external electrode 15A shown in FIG. 4. With the ratio $E_{B1}/E_{A1}$ and the ratio $E_{B2}/E_{A2}$ within the above ranges, occurrence of a tombstone defect can be reduced or prevented in flux mounting. This gives good connection with the substrate. The tombstone defect is a phenomenon where one end of the multilayer ceramic capacitor is lifted during mounting of the capacitor on the substrate.

The dimension T in the lamination direction x of the multilayer ceramic capacitor is preferably about 50 μm or greater and about 200 μm or smaller. This is because a sufficient effect of flux mounting can be achieved in the above range of the dimension T in which the strength of the multilayer ceramic capacitor is difficult to achieve.

The dimension T, the dimension L, and the dimension W each include the laminate and the external electrodes.

A multilayer ceramic capacitor according to a preferred embodiment of the present invention has a structure that can be subjected to flux mounting as described above, and can also be subjected to conventional solder mounting.

Figure 6A:
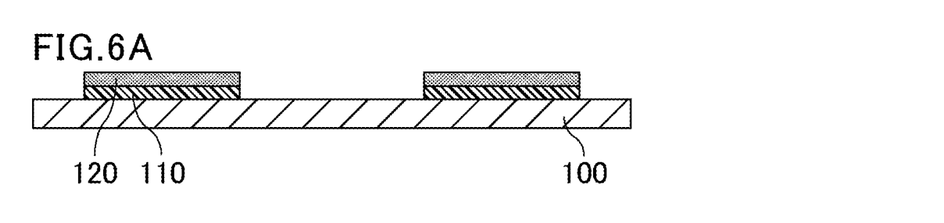
FIGS. 6A to 6C are schematic views showing solder mounting.
Figure 6B:
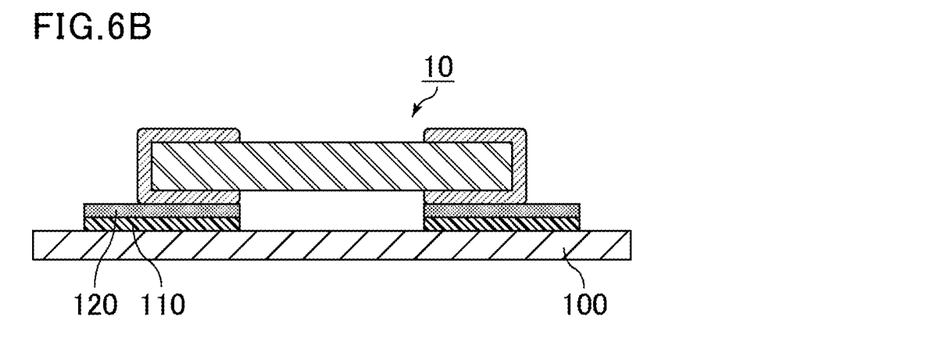
Figure 6C:
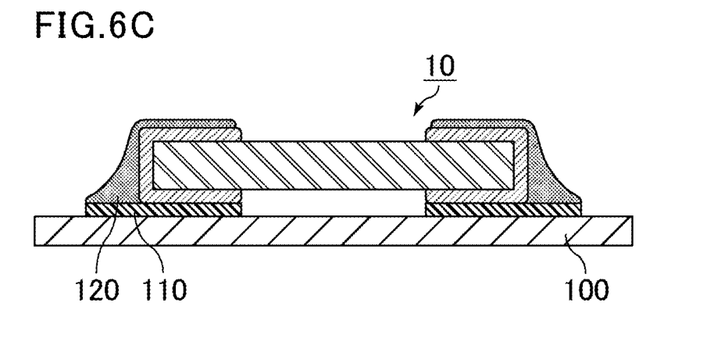

FIGS. 6A to 6C are schematic views showing solder mounting.

In solder mounting, a solder paste 120 is applied to lands 110 on a substrate 100 as shown in FIG. 6A, followed by mounting of the multilayer ceramic capacitor 10 as shown in FIG. 6B. Then, the reflow process is performed as shown in FIG. 6C, so that the electrical connection is established between the substrate 100 and the multilayer ceramic capacitor 10.

Figure 7A:
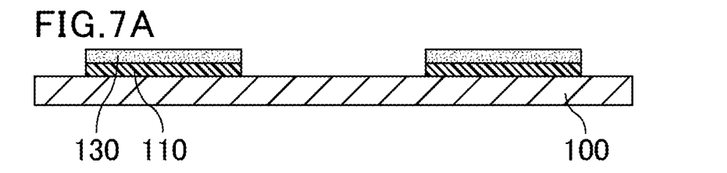
FIGS. 7A to 7C are schematic views showing flux mounting.
Figure 7B:
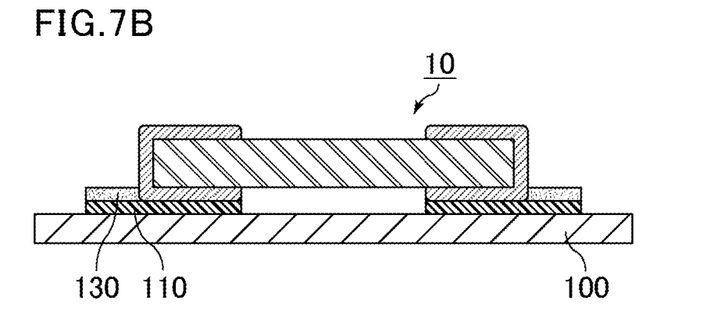
Figure 7C:
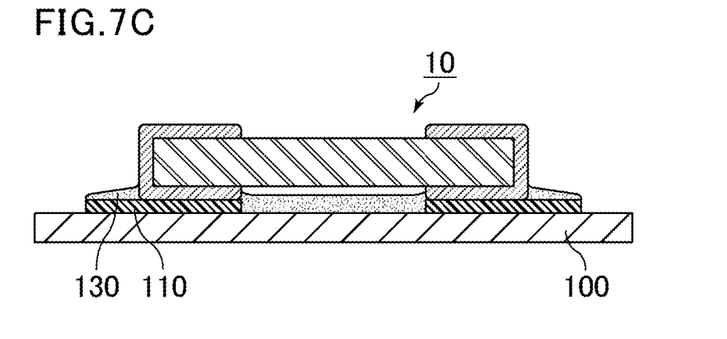

FIGS. 7A to 7C are schematic views showing flux mounting.

In flux mounting, a thermosetting resin flux 130 is applied to the lands 110 on the substrate 100 as shown in FIG. 7A, followed by mounting of the multilayer ceramic capacitor 10 as shown in FIG. 7B. Then, the reflow process is performed as shown in FIG. 7C, so that the melt of the external electrodes defining the multilayer ceramic capacitor 10 connects the lands 110 and the respective external electrodes, establishing electrical connection between the substrate 100 and the multilayer ceramic capacitor 10.

Hereinafter, a non-limiting example of a method of producing a multilayer ceramic capacitor according to a preferred embodiment of the present invention is described.

Figure 8:
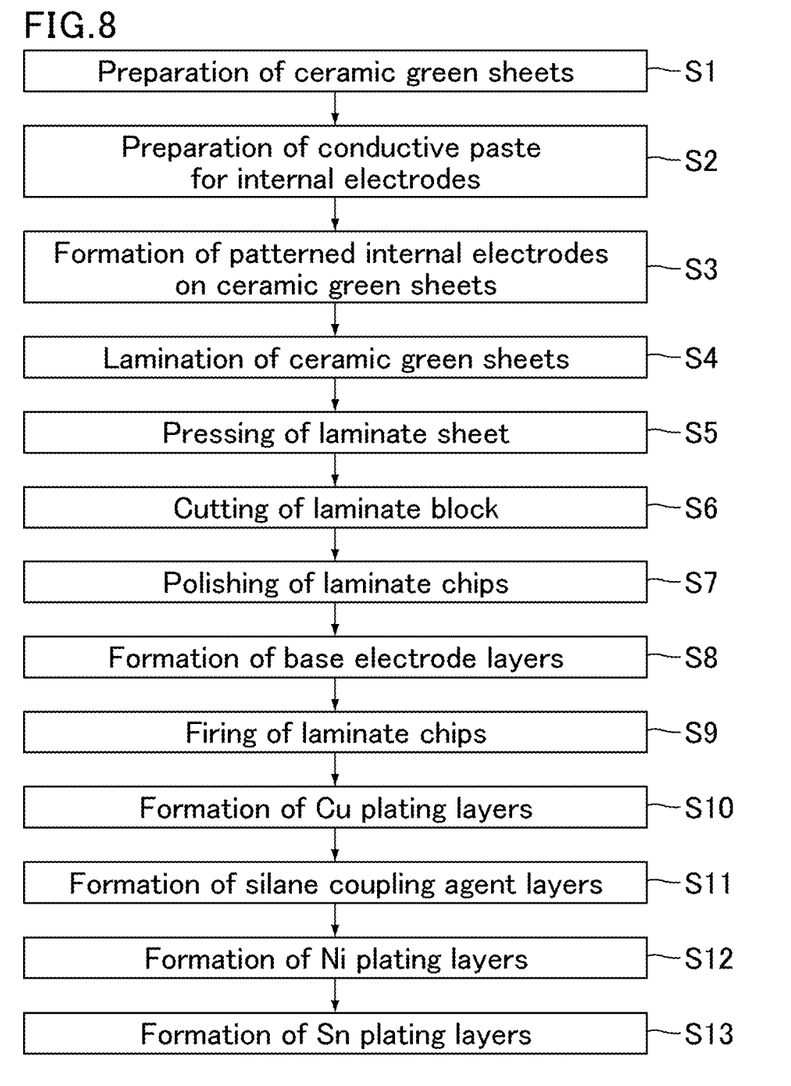
FIG. 8 is a flowchart showing an example of a method of producing a multilayer ceramic capacitor according to a preferred embodiment of the present invention.

FIG. 8 is a flowchart showing the non-limiting example of a method of producing the multilayer ceramic capacitor according to a preferred embodiment of the present invention.

First, ceramic green sheets and a conductive paste for internal electrodes are prepared (steps S1, S2). The ceramic green sheets and the conductive paste for internal electrodes include a binder (e.g., known organic binder) and a solvent (e.g., organic solvent).

Next, the conductive paste is applied to each ceramic green sheet in a predetermined pattern by, for example, screen printing or gravure printing, to form patterned internal electrodes (step S3). Specifically, a paste including a conductive material is applied to the ceramic green sheet by screen printing or gravure printing to form a conductive paste layer. The paste including a conductive material is a paste obtained by, for example, adding an organic binder and an organic solvent to metallic powder. Here, ceramic green sheets for outer layers without the patterned internal electrodes are also produced.

A laminate sheet is produced by alternately laminating ceramic green sheets with the patterned internal electrodes corresponding to the first internal electrode layers 18a and ceramic green sheets with the patterned internal electrodes corresponding to the second internal electrode layers 18b on a ceramic green sheet for an outer layer without the patterned internal electrodes, and laminating another ceramic green sheet for an outer layer without the patterned internal electrodes (step S4).

The produced laminate sheet is pressed in the lamination direction x by isostatic pressing or the like, for example, such that a laminate block is produced (step S5).

The laminate block is then cut into predetermined sized pieces to produce laminate chips (step S6). The corners and ridges of each of the laminate chips may be rounded by barrel polishing or the like, for example, (step S7). Each laminate chip corresponds to a raw laminate 12.

On each of the laminate chips, a raw base electrode layer 28 is formed (step S8). Specifically, an external electrode paste including Ni as a main component is applied by roller transfer to the first side surface 12c of the laminate chip, and optionally to a portion of surfaces of the laminate chip, such as the first main surface 12a and the second main surface 12b, to wrap around to these surfaces. Similarly, an external electrode paste including Ni as a main component is applied by roller transfer to the second side surface 12d of the laminate chip, and optionally to a portion of surfaces of the laminate chip, such as the first main surface 12a and the second main surface 12b, to wrap around to these surfaces.

The laminate chips are fired to produce the laminates 12 (step S9). Depending on the ceramic and the materials of the internal electrodes, the firing temperature is preferably about 900° C. or higher and about 1300° C. or lower, for example. The conductive paste is baked in the firing to form the internal electrode layers 18a and 18b. The external electrode paste is also baked to form the base electrode layers 28.

Then, the Cu plating layers 31 are formed to cover the surfaces of the base electrode layers 28 (step S10).

The silane coupling agent layers 26 are formed on the laminate 12 on which the layers up to the Cu plating layers 31 are formed (step S11).

First, a silane coupling agent solution is prepared. The silane coupling agent solution can be prepared by mixing a silane coupling agent and a solvent as needed.

The silane coupling agent is any one of the fluorine-based silane coupling agents and the carbon-based silane coupling agents described above.

The solvent may be, for example, methanol, ethanol, or isopropanol.

The silane coupling agent concentration in the silane coupling agent solution may preferably be, for example, about 0.1 vol % or higher and about 5 vol % or lower.

The prepared silane coupling agent solution is applied to the laminate 12 on which layers up to the Cu plating layers 31 have been formed. The silane coupling agent solution may be applied to the laminate 12 by subjecting the laminate 12 fixed onto a support such as a foam release sheet to immersion, coating, spin coating, or spraying, for example. Here, the surface of the laminate 12 farther from the support is the mounting surface, and the surface closer to the support is the counter surface. The laminate 12 to which the silane coupling agent solution has been applied is heated, such that the silane coupling agent layers 26 are formed on the laminate 12. The heating temperature may preferably be about 60° C. or higher and about 150° C. or lower, for example. The heating time may preferably be about 60 minutes or longer and about 120 minutes or shorter, for example.

The formation of the silane coupling agent layers 26 is followed by formation of the Ni plating layers 32 (step S12). The Sn plating layers 33 are then formed on the surfaces of the Ni plating layers 32 (step S13). Thus, the plating layers 30 each including the Cu plating layer 31, the Ni plating layer 32, and the Sn plating layer are formed. As a result, the first external electrode 14 and the second external electrode 15 each including the base electrode layer 28 and the plating layer 30 are formed.

Thus, the multilayer ceramic capacitor 10 shown in FIG. 1 is produced.

In production of the multilayer ceramic capacitor 10A shown in FIG. 4, step S8 may be omitted. Specifically, laminate chips without the base electrode layers 28 may be fired to produce the laminates 12, and the Cu plating layers 31 may be formed on each of the laminates 12. This forms the first external electrode 14A and the second external electrode 15A each including the plating layer 30.

EXAMPLES

Examples that more specifically disclose the multilayer ceramic capacitors according to preferred embodiments of the present invention are described below. The present invention is not limited to these examples.

Example 1

Individualized multilayer ceramic capacitors each including external electrodes having the structures shown in FIG. 2 ($E_{B1}/E_{A1}=0$, $E_{B2}/E_{A2}=0$, $E_{A1}>0$, $E_{A2}>0$) were subjected to a silane coupling agent treatment in which each capacitor was fixed on a foam release sheet support and then immersed in a silane coupling agent solution. The samples having various silane coupling agent concentrations on the mounting surface and the counter surface as shown in Table 1 were produced by controlling the types and concentrations of silane coupling agents and the number of immersion processes in the silane coupling agent solution.

Example 2

Individualized multilayer ceramic capacitors each including external electrodes having the structures shown in FIG. 4 ($E_{B1}/E_{A1}=0$, $E_{B2}/E_{A2}=0$, $E_{A1}>0$, $E_{A2>0}$) were subjected to a silane coupling agent treatment in which each capacitor was fixed on a foam release sheet support and then immersed in a silane coupling agent solution. The samples having various silane coupling agent concentrations on the mounting surface and the counter surface as shown in Table 2 were produced by controlling the types and concentrations of silane coupling agents and the number of immersion processes in the silane coupling agent solution.

As representatives of the fluorine-based silane coupling agent, $CF_3(CF_2)_5(CH_2)_2Si(OCH_3)_3$ (fluorine-based 1 (F5) in Table 1 and Table 2) and $CF_3(CF_2)_4CONH(CH_2)_3Si(OCH_3)_3$ (fluorine-based 2 (F4) in Table 1 and Table 2) were used. Also, as representatives of the carbon-based silane coupling agent, $(CH_3O)_3Si-CH_3$ (carbon-based 1 (C1) in Table 1 and Table 2) and $(CH_3O)_3Si-(CH_2)_{17}-CH_3$ (carbon-based 2 (C18) in Table 1 and Table 2) were used.

Calculation of Silane Coupling Agent Concentration

The silane coupling agent concentration A on the mounting surface and the silane coupling agent concentration B on the counter surface were calculated by the above methods. The silane coupling agent concentration ratio B/A was calculated using the obtained silane coupling agent concentrations A and B.

Evaluation of Plating Adhesion and Moisture Proof Reliability

Each of the samples was evaluated for plating adhesion and for moisture proof reliability by a moisture proof test. The number of samples used for each evaluation was 100. A thermosetting resin flux (NCX PRL-507) was used to mount each sample on a substrate for evaluation, and the reflow conditions were about 250° C., which is equal to or higher than the melting point of tin, about three minutes, and $N_2$ atmosphere.

The plating adhesion was evaluated by microscopic observation. A sample with a plating defect was regarded as a defective product, and the number of samples with a plating defect was counted.

The moisture proof reliability was evaluated by a moisture proof test in which the sample was driven with a voltage of about 3.2 V or lower at a temperature of about 125° C. and a humidity of about 95% for about 72 hours. A sample with an insulation resistance after the moisture proof test of lower than about 1 MΩ was regarded as a defective product, and the number of samples with a defect was counted.

A condition giving a plating defect ratio of 5/100 or less and a moisture proof reliability ratio of 0/100 was regarded as Good and any other condition as Poor.

TABLE 1

| | | Silane coupling agent | | | Moisture proof | | |
| --- | --- | --- | --- | --- | --- | --- | --- |
| No. | Type | Concentration A on mounting surface (F/Ba) | Concentration A on mounting surface (Si/Ba) | Concentration ratio B/A | Plating defect (X/100) | resistance defect (X/100) | Evaluation |
| 1-1 | Fluorine-based | 0.2 | — | 0.02 | 0/100 | 0/100 | Good |
| 1-2 | 1 (F5) | 0.6 | — | 0.12 | 0/100 | 0/100 | Good |
| 1-3 | | 35 | — | 0.32 | 0/100 | 0/100 | Good |
| 1-4 | | 293 | — | 0.47 | 0/100 | 0/100 | Good |
| 1-5 | | 323 | — | 0.49 | 3/100 | 0/100 | Good |
| 1-6 | | 512 | — | 0.51 | 21/100 | 0/100 | Poor |
| 1-7 | Fluorine-based | 0.1 | — | 0.03 | 0/100 | 0/100 | Good |
| 1-8 | 2 (F4) | 0.7 | — | 0.15 | 0/100 | 0/100 | Good |
| 1-9 | | 165 | — | 0.38 | 0/100 | 0/100 | Good |
| 1-10 | | 288 | — | 0.48 | 0/100 | 0/100 | Good |
| 1-11 | | 311 | — | 0.49 | 4/100 | 0/100 | Good |
| 1-12 | | 565 | — | 0.53 | 20/100 | 0/100 | Poor |
| 1-13 | Carbon-based | — | 0.95 | 0.10 | 0/100 | 0/100 | Good |
| 1-14 | 1 (C1) | — | 2.56 | 0.24 | 1/100 | 0/100 | Good |
| 1-15 | | — | 6.32 | 0.32 | 3/100 | 0/100 | Good |
| 1-16 | | — | 29.53 | 0.42 | 2/100 | 0/100 | Good |
| 1-17 | | — | 38.07 | 0.47 | 4/100 | 0/100 | Good |
| 1-18 | | — | 55.30 | 0.54 | 13/100 | 0/100 | Poor |
| 1-19 | Carbon-based | — | 0.91 | 0.11 | 0/100 | 0/100 | Good |
| 1-20 | 2 (C18) | — | 1.54 | 0.23 | 0/100 | 0/100 | Good |
| 1-21 | | — | 4.93 | 0.30 | 1/100 | 0/100 | Good |
| 1-22 | | — | 21.40 | 0.41 | 2/100 | 0/100 | Good |
| 1-23 | | — | 38.10 | 0.48 | 3/100 | 0/100 | Good |
| 1-24 | | — | 60.20 | 0.52 | 18/100 | 0/100 | Poor |
| 1-25 | N/A | — | 0.73 | 0.99 | 0/100 | 21/100 | Poor |

TABLE 2

| No. | Silane coupling agent Type | Concentration A on mounting surface (F/Ba) | Concentration A on mounting surface (Si/Ba) | Concentration ratio B/A | Plating defect (X/100) | Moisture proof resistance defect (X/100) | Evaluation |
|---|---|---|---|---|---|---|---|
| 2-1 | Fluorine-based | 0.1 | — | 0.01 | 0/100 | 0/100 | Good |
| 2-2 | 1 (F5) | 0.6 | — | 0.15 | 0/100 | 0/100 | Good |
| 2-3 | | 92 | — | 0.13 | 0/100 | 0/100 | Good |
| 2-4 | | 293 | — | 0.48 | 0/100 | 0/100 | Good |
| 2-5 | | 302 | — | 0.49 | 4/100 | 0/100 | Good |
| 2-6 | | 523 | — | 0.54 | 29/100 | 0/100 | Poor |
| 2-7 | Fluorine-based | 0.2 | — | 0.05 | 0/100 | 0/100 | Good |
| 2-8 | 2 (F4) | 0.5 | — | 0.25 | 0/100 | 0/100 | Good |
| 2-9 | | 192 | — | 0.36 | 0/100 | 0/100 | Good |
| 2-10 | | 285 | — | 0.47 | 0/100 | 0/100 | Good |
| 2-11 | | 365 | — | 0.50 | 3/100 | 0/100 | Good |
| 2-12 | | 498 | — | 0.55 | 23/100 | 0/100 | Poor |
| 2-13 | Carbon-based | — | 0.92 | 0.12 | 0/100 | 0/100 | Good |
| 2-14 | 1 (C1) | — | 2.73 | 0.21 | 1/100 | 0/100 | Good |
| 2-15 | | — | 5.42 | 0.38 | 0/100 | 0/100 | Good |
| 2-16 | | — | 22.32 | 0.42 | 2/100 | 0/100 | Good |
| 2-17 | | — | 35.20 | 0.49 | 3/100 | 0/100 | Good |
| 2-18 | | — | 57.20 | 0.52 | 15/100 | 0/100 | Poor |
| 2-19 | Carbon-based | — | 0.98 | 0.13 | 0/100 | 0/100 | Good |
| 2-20 | 2 (C18) | — | 2.32 | 0.27 | 3/100 | 0/100 | Good |
| 2-21 | | — | 7.32 | 0.32 | 1/100 | 0/100 | Good |
| 2-22 | | — | 22.60 | 0.43 | 0/100 | 0/100 | Good |
| 2-23 | | — | 30.50 | 0.49 | 1/100 | 0/100 | Good |
| 2-24 | | — | 62.20 | 0.56 | 21/100 | 0/100 | Poor |
| 2-25 | N/A | — | 0.76 | 0.97 | 0/100 | 83/100 | Poor |

As shown in Table 1 and Table 2, samples with a fluorine-based silane coupling agent as the silane coupling agent were evaluated as Good when the silane coupling agent concentration A (F/Ba) on the mounting surface was about 0.1 or more and about 365 or less. Also, samples with a carbon-based silane coupling agent were evaluated as Good when the silane coupling agent concentration A (Si/Ba) on the mounting surface was about 0.91 or higher and about 38.10 or lower.

Samples with a fluorine-based silane coupling agent as the silane coupling agent were found to cause no plating defect and give especially favorable results when the silane coupling agent concentration A (F/Ba) on the mounting surface was about 0.1 or higher and about 293 or lower.

Also, each of these silane coupling agents gave a higher coupling agent concentration on the mounting surface than on the counter surface, and led to a good result when the silane coupling agent concentration ratio B/A was about 0.50 or less.

In contrast, all of the samples without the silane coupling agent treatment caused a decrease in moisture proof reliability. This is presumably caused by corrosion due to an organic acid in the flux.

Example 3

Evaluation of Electrical Connection to Land

Multilayer ceramic capacitors having an electrode structure with ratios $E_{B1}/E_{A1}$ and $E_{B2}/E_{A2}$ of 0, 0.5, or 1 ($E_{A1}>0$, $E_{A2}>0$) were subjected to solder mounting and flux mounting to compare the land-capacitor electrical connections. The number of multilayer ceramic capacitor samples used for each evaluation was 100. The electrical connection was tested by capacity measurement. Table 3 shows the results.

TABLE 3

| $E_{B1}/E_{A1}$ | Land connection failure | | |
|---|---|---|---|
| $E_{B2}/E_{A2}$ | Solder mounting | Flux mounting | Evaluation |
| 1 | 0/100 | 1/100 | Good |
| 0.5 | 0/100 | 0/100 | Excellent |
| 0 | 0/100 | 0/100 | Excellent |

As shown in Table 3, a sample with ratios $E_{B1}/E_{A1}$ and $E_{B2}/E_{A2}$ of more than about 0.5 was found to have connection failure in the case of flux mounting. The cross-sectional observation thereof suggests that a tombstone defect caused the failure. In contrast, samples with ratios $E_{B1}/E_{A1}$ and $E_{B2}/E_{A2}$ of about 0.5 or less had no tombstone defect and showed no connection failure.

Example 4

Evaluation of Thermal Shock Resistance

Multilayer ceramic capacitors having an electrode structure with ratios $E_{B1}/E_{A1}$ and $E_{B2}/E_{A2}$ of 0 ($E_{A1}>0$, $E_{A2}>0$) were subjected to solder mounting and flux mounting to compare the thermal shock resistances. The number of multilayer ceramic capacitor samples used for each evaluation was 30. Each sample mounted on a four-layer substrate by one of the mounting methods was subjected to the thermal shock resistance test within a temperature range of about −55° C. to about 125° C. for 100 cycles. Defects of the internal structure were checked by grinding the LT surface to a position corresponding to about half the dimension in the width direction of an external electrode on the main surface and checking whether there is a crack. In the case of solder mounting, a crack was detected in five samples out of 30 samples. In contrast, in the case of flux mounting, a crack was detected in none of 30 samples. These results show that flux mounting leads to a higher thermal shock resistance than solder mounting.

Example 5

Evaluation of Mounting Thickness Reduction Effect

The multilayer ceramic capacitors having an electrode structure with ratios $E_{B1}/E_{A1}$ and $E_{B2}/E_{A2}$ of 0 ($E_{A1}>0$, $E_{A2}>0$) were subjected to solder mounting and flux mounting to confirm the mounting thickness reduction effect achieved by flux mounting. The multilayer ceramic capacitor samples evaluated had a dimension T of about 50 μm with which the capacitor strength is especially problematic. The mounting thickness was measured by grinding the LT surface to a position corresponding to about half the dimension in the width direction of an external electrode on the main surface and observing the cross section. The samples in the case of flux mounting were found to reduce the mounting thickness by about 29% as compared to the samples in the case of solder mounting. These results show that even with a dimension T of about 50 μm, the mounting thickness can be reduced by mounting the capacitor by flux mounting as compared to the case of mounting the capacitor by solder mounting. The thickness of the capacitor can be increased by the amount corresponding to the reduced mounting thickness, so that the flexural strength can be increased. The same evaluation on a multilayer ceramic capacitor with a dimension T of about 200 μm revealed the same effect.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
   a laminate including a plurality of dielectric layers and a plurality of internal electrode layers laminated together; and
   external electrodes on surfaces of the laminate and electrically connected to the plurality of internal electrode layers; wherein
   a silane coupling agent layer is provided on at least a mounting surface among surfaces of the laminate;
   the silane coupling agent layer is made of a fluorine-based silane coupling agent;
   a silane coupling agent concentration, defined as a ratio F/Ba of a F atom concentration to a Ba atom concentration on the laminate, on the mounting surface is about 0.1 or higher and about 365 or lower and is higher than a silane coupling agent concentration on a counter surface opposing the mounting surface.

2. The multilayer ceramic capacitor according to claim 1, wherein the silane coupling agent concentration on the mounting surface is about 0.1 or higher and about 293 or lower.

3. The multilayer ceramic capacitor according to claim 1, wherein a silane coupling agent concentration ratio B/A is about 0.50 or less, where A represents the silane coupling agent concentration on the mounting surface and B represents the silane coupling agent concentration on the counter surface.

4. The multilayer ceramic capacitor according to claim 1, wherein
   the laminate includes a first main surface and a second main surface that oppose each other in a lamination direction, a first side surface and a second side surface that oppose each other in a length direction perpendicular or substantially perpendicular to the lamination direction, and a third side surface and a fourth side surface that oppose each other in a width direction perpendicular or substantially perpendicular to the lamination direction and the length direction;
   the first main surface of the laminate is the mounting surface and the second main surface of the laminate is the counter surface;
   the external electrodes include a first external electrode on the first side surface of the laminate and a second external electrode on the second side surface of the laminate;
   a length ratio $E_{B1}/E_{A1}$ of the first external electrode wrapping around to the main surfaces is about 0 or more and about 0.5 or less, where $E_{A1}$ represents a distance from an end of the first external electrode wrapping around to the first main surface of the laminate to the first side surface of the laminate, and $E_{B1}$ represents a distance from an end of the first external electrode wrapping around to the second main surface of the laminate to the first side surface of the laminate; and
   a length ratio $E_{B2}/E_{A2}$ of the second external electrode wrapping around to the main surfaces is about 0 or more and about 0.5 or less, where $E_{A2}$ represents a distance from an end of the second external electrode wrapping around to the first main surface of the laminate to the second side surface of the laminate, and $E_{B2}$ represents a distance from an end of the second external electrode wrapping around to the second main surface of the laminate to the second side surface of the laminate.

5. The multilayer ceramic capacitor according to claim 1, wherein a dimension T in a lamination direction of the multilayer ceramic capacitor is about 50 μm or greater and about 200 μm or smaller.

6. The multilayer ceramic capacitor according to claim 1, wherein the fluorine-based silane coupling agent is represented by:

$$CF_3-(CF_2)_{n1}-R-Si(O-R')_3,$$

where n1 is an integer of 0 or greater, R is a substituent including Si or O or alkylene group, and R' is an alkyl group.

7. The multilayer ceramic capacitor according to claim 1, wherein the silane coupling agent includes at least one alkoxy group and at least one perfluoroalkyl group.

8. The multilayer ceramic capacitor according to claim 1, wherein each of the external electrodes includes a base electrode layer and a plating layer.

9. The multilayer ceramic capacitor according to claim 8, wherein the base electrode layer is a baked electrode layer including glass and metal.

10. The multilayer ceramic capacitor according to claim 8, wherein the plating layer includes at least one selected from Ni, Sn, Cu, Ag, Pd, an Ag—Pd alloy, and Au.

11. The multilayer ceramic capacitor according to claim 8, wherein the plating layer includes a Cu plating layer and a Ni plating layer.

12. A multilayer ceramic capacitor comprising:
   a laminate including a plurality of dielectric layers and a plurality of internal electrode layers laminated together; and
   external electrodes on surfaces of the laminate and electrically connected to the plurality of internal electrode layers; wherein
   a silane coupling agent is provided on at least a mounting surface among surfaces of the laminate;

the silane coupling agent layer is made of a carbon-based silane coupling agent;

a silane coupling agent concentration, defined as a ratio Si/Ba of a Si atom concentration to a Ba atom concentration on the laminate, on the mounting surface is about 0.91 or higher and about 38.10 or lower and is higher than a silane coupling agent concentration on a counter surface opposing the mounting surface.

13. The multilayer ceramic capacitor according to claim 3, wherein a silane coupling agent concentration ratio B/A is about 0.50 or less, where A represents the silane coupling agent concentration on the mounting surface and B represents the silane coupling agent concentration on the counter surface.

14. The multilayer ceramic capacitor according to claim 3, wherein
the laminate includes a first main surface and a second main surface that oppose each other in a lamination direction, a first side surface and a second side surface that oppose each other in a length direction perpendicular or substantially perpendicular to the lamination direction, and a third side surface and a fourth side surface that oppose each other in a width direction perpendicular or substantially perpendicular to the lamination direction and the length direction;
the first main surface of the laminate is the mounting surface and the second main surface of the laminate is the counter surface;
the external electrodes include a first external electrode on the first side surface of the laminate and a second external electrode on the second side surface of the laminate;
a length ratio $E_{B1}/E_{A1}$ of the first external electrode wrapping around to the main surfaces is about 0 or more and about 0.5 or less, where $E_{A1}$ represents a distance from an end of the first external electrode wrapping around to the first main surface of the laminate to the first side surface of the laminate, and $E_{B1}$ represents a distance from an end of the first external electrode wrapping around to the second main surface of the laminate to the first side surface of the laminate; and a length ratio $E_{B2}/E_{A2}$ of the second external electrode wrapping around to the main surfaces is about 0 or more and about 0.5 or less, where $E_{A2}$ represents a distance from an end of the second external electrode wrapping around to the first main surface of the laminate to the second side surface of the laminate, and $E_{B2}$ represents a distance from an end of the second external electrode wrapping around to the second main surface of the laminate to the second side surface of the laminate.

15. The multilayer ceramic capacitor according to claim 12, wherein a dimension T in a lamination direction of the multilayer ceramic capacitor is about 50 μm or greater and about 200 μm or smaller.

16. The multilayer ceramic capacitor according to claim 12, wherein the carbon-based silane coupling agent is represented by:

$$(RO)_3Si-(CH_2)_{n2}-CH_3,$$

where n2 is an integer of 0 or greater and 17 or smaller and R is a methyl or ethyl group.

17. The multilayer ceramic capacitor according to claim 12, wherein each of the external electrodes includes a base electrode layer and a plating layer.

18. The multilayer ceramic capacitor according to claim 17, wherein the base electrode layer is a baked electrode layer including glass and metal.

19. The multilayer ceramic capacitor according to claim 17, wherein the plating layer includes at least one selected from Ni, Sn, Cu, Ag, Pd, an Ag—Pd alloy, and Au.

20. The multilayer ceramic capacitor according to claim 17, wherein the plating layer includes a Cu plating layer and a Ni plating layer.

* * * * *